United States Patent [19]
Arnould et al.

[11] Patent Number: 6,118,314
[45] Date of Patent: Sep. 12, 2000

[54] CIRCUIT ASSEMBLY AND METHOD OF SYNCHRONIZING PLURAL CIRCUITS

[75] Inventors: Patrick Arnould, Antibes, France; Frederic Hayem, San Diego, Calif.

[73] Assignee: VLSI Technology, Inc., Sunnyvale, Calif.

[21] Appl. No.: 09/173,441

[22] Filed: Oct. 14, 1998

[51] Int. Cl.$^7$ ........................................................ H03L 7/00
[52] U.S. Cl. .......................... 327/141; 327/142; 327/198; 327/202
[58] Field of Search ..................................... 327/141, 142, 327/143, 144, 145, 198, 202

[56] References Cited

U.S. PATENT DOCUMENTS

| | | | |
|---|---|---|---|
| 5,510,740 | 4/1996 | Farrell et al. ............................ | 327/142 |
| 5,634,116 | 5/1997 | Singer ..................................... | 395/551 |
| 5,751,665 | 5/1998 | Tanoi ...................................... | 327/149 |
| 5,808,494 | 9/1998 | Chang et al. ............................ | 327/147 |
| 5,859,549 | 1/1999 | Shuholm ................................. | 327/151 |

*Primary Examiner*—Timothy P. Callahan
*Assistant Examiner*—An T. Luu
*Attorney, Agent, or Firm*—Wells, St. John, Roberts, Gregory & Matkins, PS

[57] ABSTRACT

The present invention includes a circuit assembly and method of synchronizing plural circuits. According to one aspect of the present invention, a circuit includes: an oscillator configured to generate a reference clock signal; a first circuit including: a first divider configured to generate a first internal clock signal responsive to the reference clock signal; and reset generation circuitry configured to receive an external reset signal and generate a reset second circuit signal synchronized with a predefined position of the first divider, with the reference clock signal and with the external reset signal; and a second circuit including: reset detection circuitry configured to generate a reset detection signal synchronized with the reset second circuit signal and the reference clock signal; and a second divider configured to set to a predefined position responsive to the reception of the reset detection signal and generate a second internal clock signal synchronized with the first internal clock signal.

54 Claims, 5 Drawing Sheets

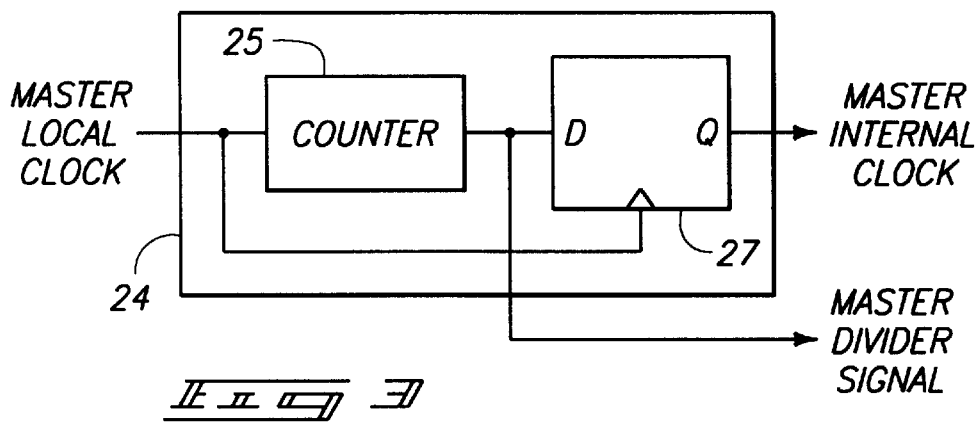
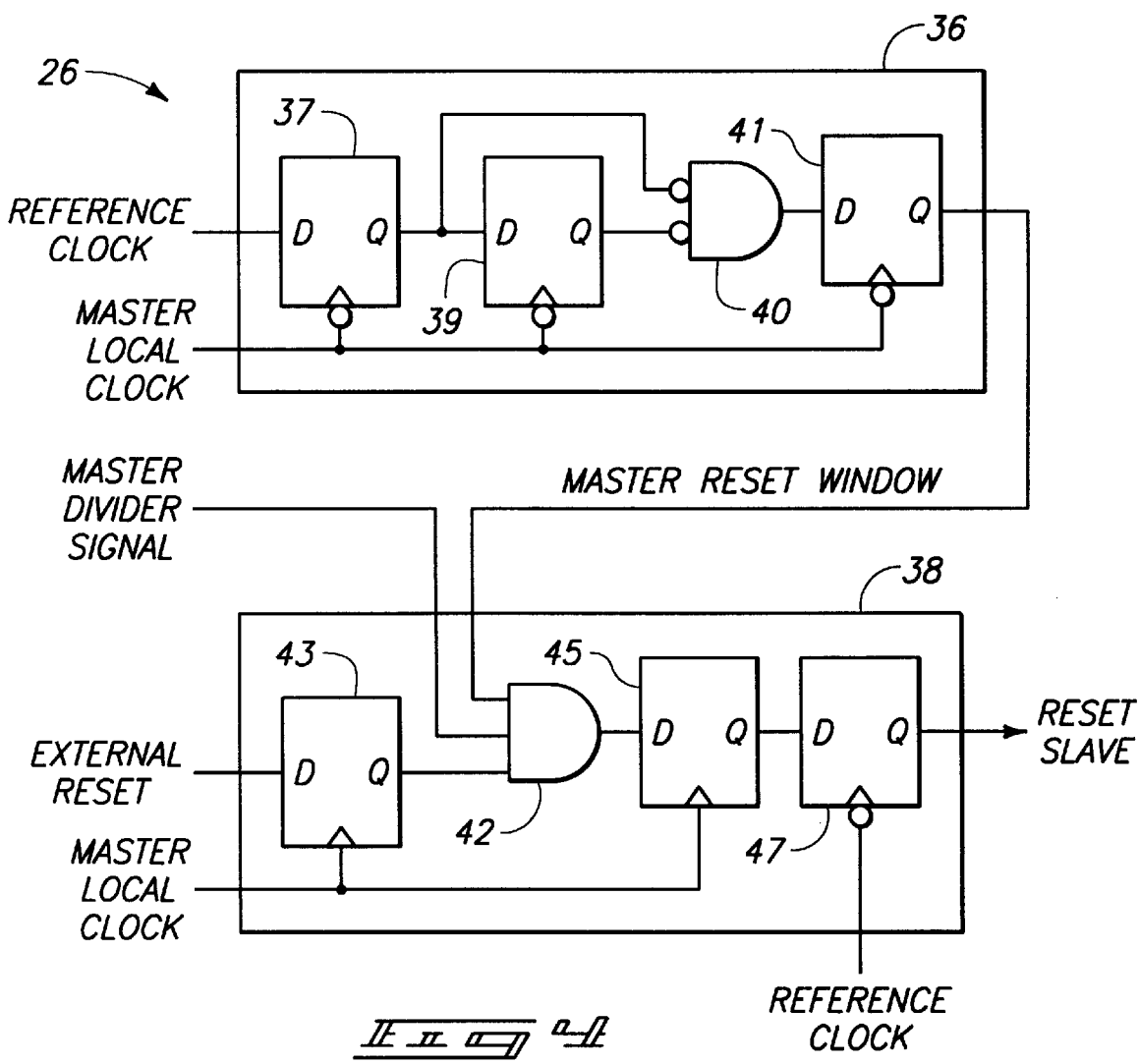

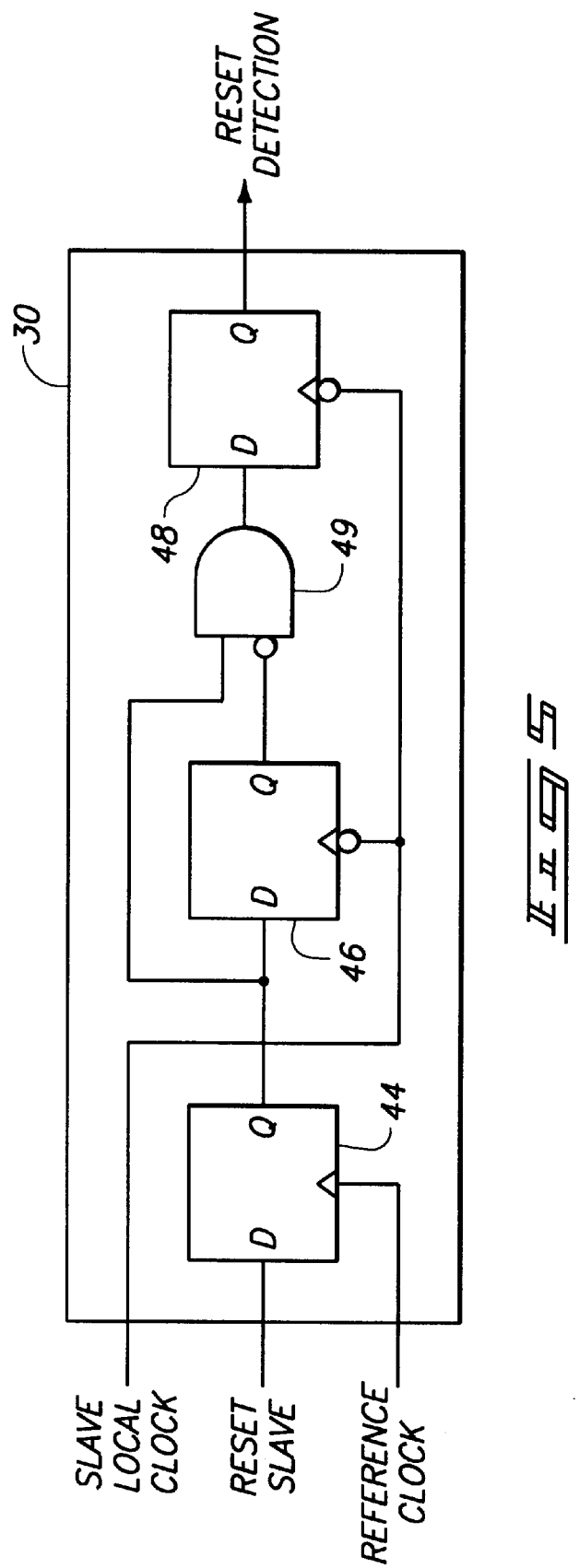

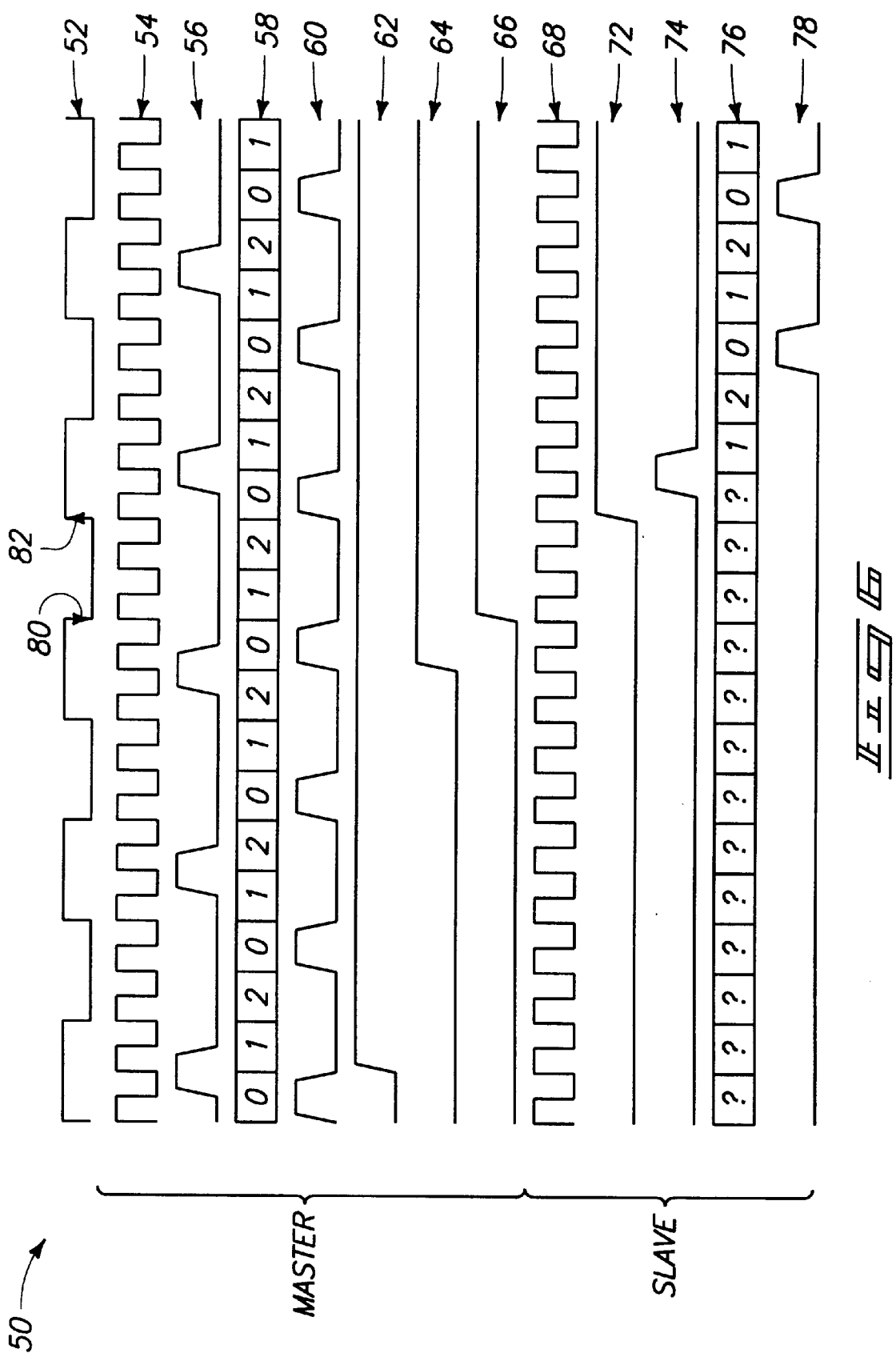

6,118,314

CIRCUIT ASSEMBLY AND METHOD OF SYNCHRONIZING PLURAL CIRCUITS

TECHNICAL FIELD

The present invention relates to a circuit assembly and method of synchronizing plural circuits.

BACKGROUND OF THE INVENTION

Some electrical devices include multiple processors, controllers or other dedicated circuits to provide a plurality of distinct functions. Some of the processors and controllers can be individually configured to perform a predefined function. Another processor can be provided to oversee and monitor the operations of the individual processors. Such arrangements are typically provided in master/slave configurations wherein the slave circuitry operates responsive to commands from the master circuitry.

For example, in wireless communications, one base station is typically configured to communicate with a plurality of remote handsets or portable stations. The base station can have a plurality of specific circuits which are individually configured to provide wireless communications with a remote portable station. In particular, some conventional base station arrangements have a master processor configured to communicate with and monitor the operation of a plurality of slave processors.

Regardless of the particular configuration, it is often desired for two or more processors, or other circuits, to communicate or exchange commands and/or data. Synchronization of the communicating circuits facilitates communications and data exchange. The circuits typically include individual clocks configured to provide internal timings for the respective circuits. It is desired to synchronize the internal clock of a first circuit with the internal clock of a second circuit to facilitate communications between the circuits. Following appropriate synchronization, data exchange can occur at increased rates intermediate the synchronized circuits.

Therefore, a need exists for providing synchronization intermediate plural communicating circuits.

BRIEF DESCRIPTION OF THE DRAWINGS

Preferred embodiments of the invention are described below with reference to the following accompanying drawings.

FIG. 3 is a functional block diagram of one embodiment of master divider circuitry of the master circuit.

FIG. 4 is a functional block diagram of one embodiment of reset generation circuitry of the master circuit.

FIG. 5 is a functional block diagram of one embodiment of reset detection circuitry of the slave circuit.

FIG. 6 is a timing diagram illustrating a plurality of signals within the master circuit and slave circuit.

DETAILED DESCRIPTION OF THE PREFERRED EMBODIMENTS

Figure 1:
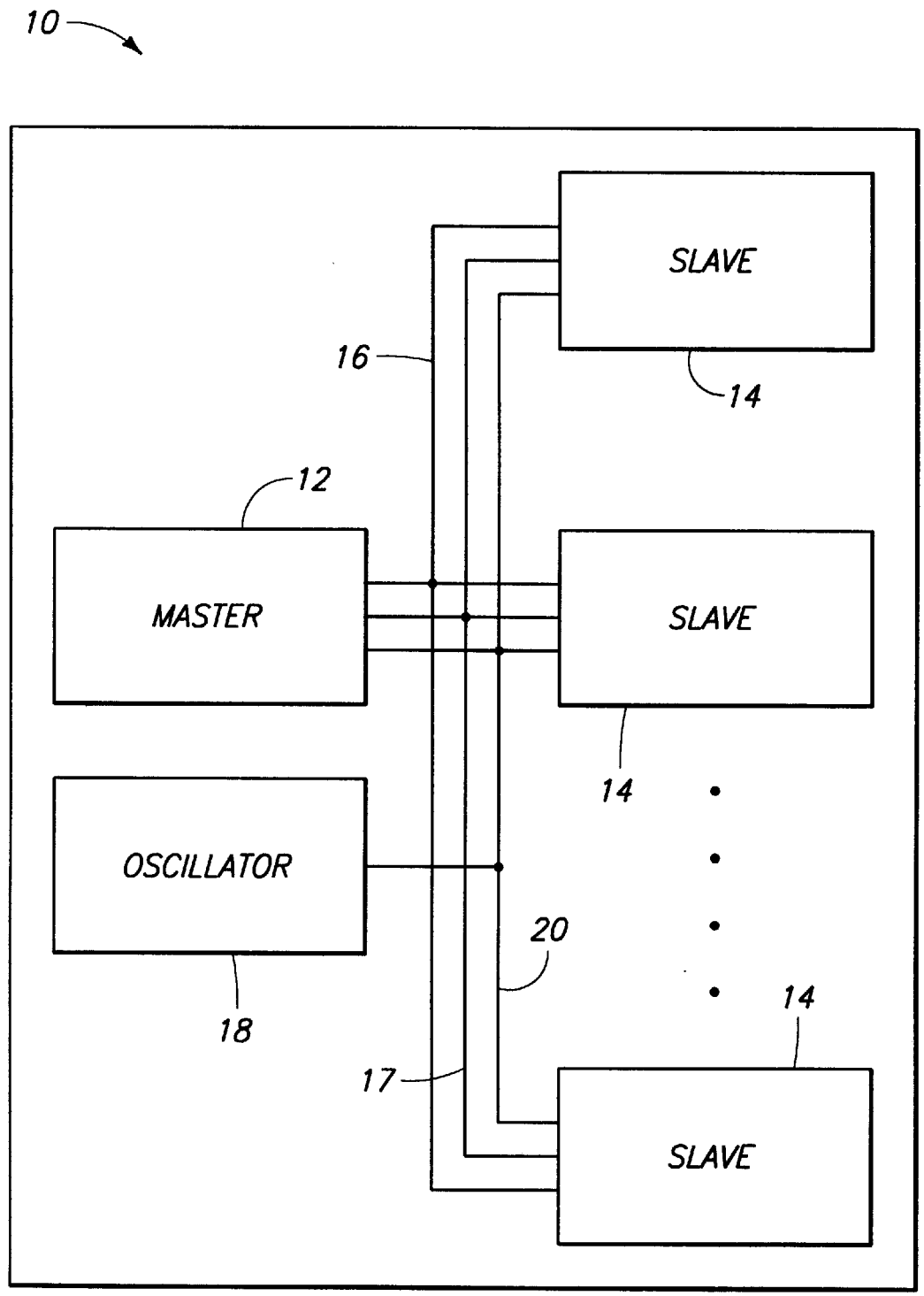
FIG. 1 is a functional block diagram of a communication device base station.

This disclosure of the invention is submitted in furtherance of the constitutional purposes of the U.S. Patent Laws "to promote the progress of science and useful arts" (Article 1, Section 8).

According to one aspect of the present invention, a circuit assembly comprises: an oscillator configured to generate a reference clock signal; a first circuit including: a first divider configured to generate a first internal clock signal responsive to the reference clock signal; and reset generation circuitry configured to receive an external reset signal and generate a reset second circuit signal synchronized with a predefined position of the first divider, with the reference clock signal and with the external reset signal; and a second circuit including: reset detection circuitry configured to generate a reset detection signal synchronized with the reset second circuit signal and the reference clock signal; and a second divider configured to set to a predefined position responsive to the reception of the reset detection signal and generate a second internal clock signal synchronized with the first internal clock signal.

A second aspect of the present invention provides a circuit assembly comprising: a first circuit configured to receive an external reset signal and generate a first internal clock signal using a first divider, the first circuit being further configured to generate a reset second circuit signal synchronized with the external reset signal and a set position of the first divider; and a second circuit configured to receive the reset second circuit signal and generate a second internal clock signal using a second divider, the second circuit being further configured to set a position of the second divider responsive to the reset second circuit signal to synchronize the second internal clock signal with the first internal clock signal.

Another aspect of the present invention provides a circuit assembly comprising: a first circuit configured to receive an external reset signal and generate a first internal clock signal, the first circuit being further configured to generate a reset second circuit signal responsive to the external reset signal; and a second circuit configured to receive the reset second circuit signal and generate a second internal clock signal synchronized with the first internal clock signal, the second circuit being configured to generate the second internal clock signal responsive to the reset second circuit signal.

According to another aspect, the present invention provides a circuit assembly comprising: an oscillator configured to generate a reference clock signal; a first circuit coupled with the oscillator and configured to receive the reference clock signal, the first circuit including: first phase lock loop circuitry configured to generate a first local clock signal responsive to the reference clock signal; a first divider configured to generate a first internal clock signal responsive to the first local clock signal and a first divider signal indicating a position of the first divider; and reset generation circuitry coupled with the oscillator, first phase lock loop circuitry and first divider and configured to receive an external reset signal, the reset generation circuitry being configured to generate a reset second circuit signal synchronized with the first divider signal, with the reference clock signal and with the external reset signal; and a second circuit coupled with the oscillator and the first circuit, the second circuit including: second phase lock loop circuitry configured to generate a second local clock signal responsive to the reference clock signal; reset detection circuitry coupled with the oscillator, reset generation circuitry, and second phase lock loop circuitry, and the reset detection circuitry being configured to generate a reset detection signal responsive to synchronization of the reset second circuit signal and the reference clock signal; and a second divider configured to set to a position responsive to reception of the reset detection signal and generate a second internal clock signal synchronized with the first internal clock signal, the second divider being further configured to generate the second internal clock signal responsive to the second local clock signal and the position of the second divider being set.

Another aspect of the present invention provides a method of synchronizing plural circuits comprising: applying a reference clock signal to a first circuit and a second circuit; generating a first internal clock signal responsive to the reference clock signal using a first divider; receiving an external reset signal within the first circuit; generating a reset second circuit signal synchronized with the external reset signal and a position of the first divider; setting a position of a second divider responsive to the reset second circuit signal; and generating a second internal clock signal synchronized with the first internal clock signal, the generating the second internal clock signal being responsive to the setting.

Another method of synchronizing a second circuit with a first circuit according to the present invention comprises: providing a first circuit coupled with a second circuit; generating a first internal clock signal using a first divider; receiving an external reset signal within the first circuit; generating a reset second circuit signal responsive to the external reset signal; setting a position of a second divider responsive to the reset second circuit signal; and generating a second internal clock signal synchronized with the first internal clock signal, the generating the second internal clock signal being responsive to the setting.

Another aspect of the present invention provides a method of synchronizing plural circuits comprising: generating a first internal clock signal to provide timing within a first circuit; receiving an external reset signal within the first circuit; generating a reset second circuit signal using the first circuit responsive to the external reset signal; receiving the reset second circuit signal within a second circuit coupled with the first circuit; and generating a second internal clock signal synchronized with the first internal clock signal to provide timing within the second circuit, the generating the second internal clock signal being responsive to the receiving the reset second circuit signal.

Yet another method of synchronizing plural circuits comprises: first generating a first internal clock signal using a first divider; timing operations of a first circuit using the first internal clock signal; receiving an external reset signal; setting a second divider to a predefined position following the receiving the external reset signal; second generating a second internal clock signal following the setting and using the second divider, the second internal clock signal being synchronized with the first internal clock signal; and timing operations of a second circuit using the second internal clock signal.

Referring to FIG. 1, an electrical device 10 is illustrated comprising a plurality of internal circuits. In one exemplary embodiment, electrical device 10 comprises a wireless communications base station. As shown, the internal circuits include a first or master circuit 12 and plurality of second or slave circuits 14. Master circuit 12 can be configured to control and oversee operations of slave circuits 14.

The present embodiment is described with reference to a master/slave relationship of circuits to be synchronized. The described embodiment is exemplary and other configurations are possible. In particular, the present invention applies to any configuration wherein synchronization of two (first and second) circuits is desired.

In one application, electrical device 10 comprises a base station of a digital european cordless telecommunication (DECT) system. Electrical device 10 comprising a base station includes plural slave circuits 14 configured to individually communicate with remote communication devices (not shown). Master circuit 12 is coupled with the individual slave circuits 14 and is configured to control the operations thereof. In addition, master circuit 12 and slave circuits 14 are configured to communicate data therebetween utilizing an internal bus 16. Reset signals described below are applied from master circuit 12 to slave circuits 14 using a connection 17.

An oscillator 18 is provided within electrical device 10 to establish a common timing reference within device 10. In the described embodiment, oscillator 18 is configured to generate a reference clock signal and apply the reference clock signal via bus 20 to master circuit 12 and individual slave circuits 14. The reference clock signal received from oscillator 18 has a given frequency (e.g., 10 MHz).

Figure 2:
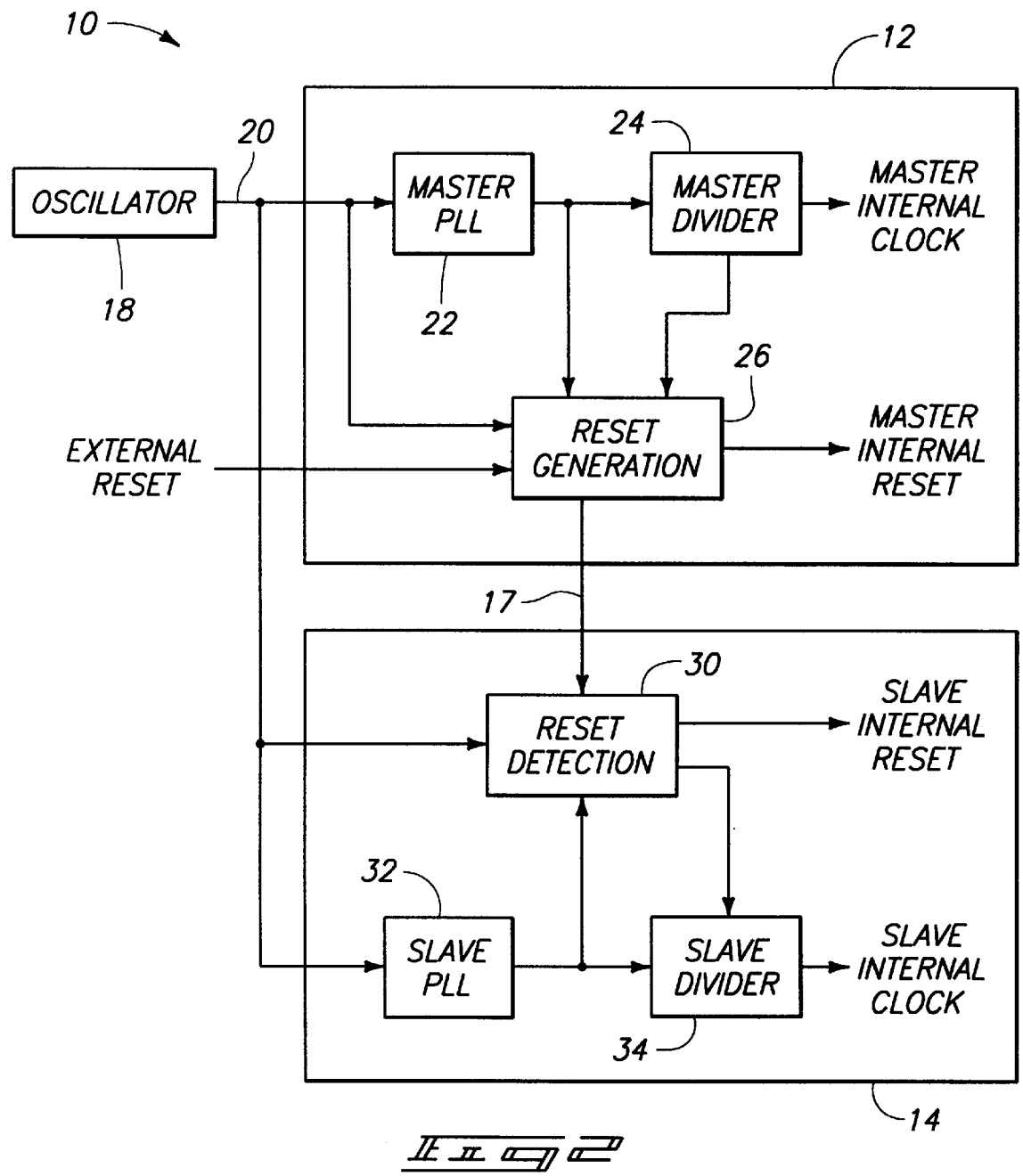
FIG. 2 is a functional block diagram of a master circuit coupled with a slave circuit.

Referring to FIG. 2, an exemplary master circuit 12 and slave circuit 14 are illustrated. Master circuit 12 includes a master phase lock loop (PLL) 22, master divider 24 and reset generation circuitry 26. The depicted slave circuit 14 comprises reset detection circuitry 30, slave phase lock loop (PLL) 32 and slave divider 34.

Master phase lock loop 22 and slave phase lock loop 32 are individually coupled with bus 20 and are configured to receive the reference clock signal from oscillator 18. Master phase lock loop 22 and slave phase lock loop 32 are respectively configured to generate a master local clock signal and slave local clock signal responsive to the reference clock signal.

In the described embodiment, the master local clock signal and slave local clock signal individually have a frequency which is greater than the frequency of the reference clock signal. For example, the master local clock signal and the slave local clock signal individually have a frequency which is four times the frequency of the reference clock signal. In such a configuration, master phase lock loop circuitry 22 and slave phase lock loop circuitry 32 individually comprise times four multipliers which operate to multiply the frequency of the reference clock signal by four.

The master local clock signal is applied to master divider 24 and reset generation circuitry 26. The outputted slave local clock signal is applied to reset detection circuitry 30 and slave divider 34. Master divider 24 is configured to generate a master internal clock signal and a master divider signal responsive to the master local clock signal. The master divider signal indicates a corresponding position or count of master divider 24. Slave divider 34 is configured to generate a slave internal clock signal synchronized with the master internal clock signal.

In the described embodiment, master divider 24 and slave divider 34 individually include counters configured to divide the frequency of the master local clock signal and slave local clock signal, respectively. For example, master divider 24 and slave divider 34 are individually configured to divide the master local clock and slave local clock by three. In other words, master divider 24 and slave divider 34 are configured to repeatedly count three positions.

Individual pulses within master local clock signal and the slave local clock signal increase the count or position of master divider 24 and slave divider 34, respectively. Accordingly, master divider 24 and slave divider 34 are individually configured to count for example position zero, position one, position two, position zero, etc. Master divider 24 and slave divider 34 are operable in the described embodiment to output a logic high signal corresponding to a predefined position (e.g., zero) and otherwise a logic low signal during other positions. The master internal clock signal and slave internal clock signal are applied to respective internal components (not shown) of master circuit 12 and slave circuit 14 to provide synchronized timing as described in detail below. Synchronization of the master internal clock signal and slave internal clock signal facilitates data exchange intermediate internal components of master circuit 12 and slave circuit 14.

The slave internal clock signal outputted from slave divider 34 is preferably synchronized with the master internal clock signal from master divider 24. Accordingly, slave divider 34 is synchronized with master divider 24 to provide synchronization of respective internal clock signals in the preferred embodiment. Slave divider 34 is set to a predefined position corresponding to the position of master divider 24.

Reset generation circuitry 26 is coupled with oscillator 18, master phase lock loop 22 and master divider 24. Reset generation circuitry 26 is configured to receive the master local clock signal from master phase lock loop 22 and the master divider signal from master divider circuitry 24. Reset generation circuitry 26 is also configured to receive an external reset signal from circuitry external to master device 12. Such an external reset signal can be generated responsive to a power on condition of electrical device 10, following the lapse of a predefined time period or any other desired condition.

Reset generation circuitry 26 is configured to output a master internal reset signal for use in resetting other internal components within master circuit 12. Reset generation circuitry 26 is also configured to output a reset slave signal, also referred to as a reset second circuit signal, to slave circuit 14.

In the preferred embodiment, reset generation circuitry 26 is configured to generate the reset slave signal responsive to the master divider signal, the reference clock signal, the external reset signal, and the master local clock signal. In such an embodiment, reset generation circuitry 26 is configured to output the reset slave signal using a connection 17 responsive to synchronization of the master divider signal, the reference clock signal, the external reset signal, and the master local clock signal as described with reference to the timing diagram of FIG. 6.

Reset detection circuitry 30 of slave circuit 14 is coupled with oscillator 18, reset generation circuitry 26 and slave phase lock loop 32. Reset detection circuitry 30 is configured to receive the reference clock signal from oscillator 18, the reset slave signal from reset generation circuitry 26 and the slave local clock signal from slave phase lock loop 32.

Reset detection circuitry 30 is configured to output a slave internal reset signal utilized for resetting other internal components of slave circuitry 14. Reset detection circuitry 30 is also configured to output a reset detection signal to slave divider circuitry 34. Reset detection circuitry 30 is configured to generate the reset detection signal responsive to the reset slave signal, the slave local clock signal and the reference clock signal. In the described embodiment, reset detection circuitry 30 is configured to output the reset detection signal responsive to synchronization of the reset slave signal, the slave local clock signal and the reference clock signal.

Slave divider 34 is configured to receive the reset detection signal from reset detection circuitry 30. Slave divider 34 is configured to set to a predefined position (e.g., position one) responsive to reception of the reset detection signal. Slave divider 34 is configured to set to the predefined position to synchronize with master divider 24 and provide synchronized timing of master circuit 12 and slave circuit 14. The predefined position of slave divider 34 corresponds to a predefined position of master divider 24.

Slave divider 34 is configured to generate a slave internal clock signal synchronized with the master internal clock signal. The slave internal clock signal is outputted responsive to reception of the slave local clock signal, the reset detection signal and the slave divider 34 being set to a predefined position. Synchronization of the master internal clock signal and the slave internal clock signal establishes a common timing of master circuit 12 and slave circuit 14. Such facilitates the communication of data intermediate master circuit 12 and slave circuit 14.

Referring to FIG. 3, one embodiment of master divider 24 is illustrated. The depicted master divider 24 includes a counter 25 and a D-type flip-flop 27. Counter 25 is coupled with master phase lock loop 22 and is configured to receive the master local clock signal from master phase lock loop 22. In addition, the master local clock signal is applied to the clock input of D flip-flop 27. Counter 25 is configured to incrementally count, for example, from position zero to position one to position two to position zero, etc. responsive to the master local clock signal.

According to the described embodiment, counter 25 is configured to output an indication signal (e.g., logic high signal) corresponding to a predefined or last position (i.e., position two) of counter 25 to D-type flip-flop 27. Otherwise, counter 25 outputs a logic low signal during counting of other positions (i.e., position one and position two) of counter 25. The outputted signal from counter 25 comprises the master divider signal.

D-type flip-flop 27 is configured to output the master internal clock signal responsive to the master divider signal generated by counter 25. The master internal clock signal is utilized for timing within master circuit 12. The master divider signal is utilized in the described embodiment to set the master internal reset signal and timing within slave circuits 14 coupled with master circuit 12. Slave divider 34 can comprise the configuration of master divider 24 shown in FIG. 3.

Referring to FIG. 4, one embodiment of reset generation circuitry 26 is illustrated. The depicted reset generation circuitry 26 includes master reset window circuitry 36 and reset slave circuitry 38. Master reset window circuitry 36 comprises D-type flip-flops 37, 39, 41 and AND gate 40 arranged as shown. D-type flip-flops 37, 39, 41 are configured to receive timing from the inverse of the master local clock signal outputted by master phase lock loop circuitry 22.

First D-type flip-flop 37 has a D input coupled with the reference clock from oscillator 18. The Q output of D-type flip-flop 37 is applied to the D input of flip-flop 39. Further, the inverse of the output of flip-flop 37 is applied to AND gate 40. The inverse of the Q output of flip-flop 39 is also applied to AND gate 40. The output of AND gate 40 is applied to the D input of D-type flip-flop 41. The output of D-type flip-flop 41 comprises a master reset window signal.

Reset slave circuitry 38 comprises plural D-type flip-flops 43, 45, 47 and an AND gate 42 arranged as shown. First D flip-flop 43 is configured to receive the external reset signal externally generated and applied to reset generation circuitry 26. First and second D flip-flops 43, 45 are operable to receive the master local clock signal from phase lock loop circuitry 22 to provide timing. Third D-type flip-flop 47 is coupled with oscillator 18 to receive the inverse of the reference clock for timing.

The Q output of first D flip-flop 43 is applied to AND gate 42. AND gate 42 is also configured to receive the master divider signal outputted from master divider 24 and the master reset window signal generated within circuitry 36. The output of AND gate 42 is applied to the D input of second D flip-flop 45. The Q output of D flip-flop 45 is applied to the D input of third D flip-flop 47. The Q output of third D flip-flop 47 comprises the reset slave signal which is applied to reset detection circuitry 30 of slave circuit 14.

Referring to FIG. 5, one embodiment of reset detection circuitry 30 is illustrated. The depicted reset detection circuitry 30 comprises plural D-type flip-flops 44, 46, 48 and AND gate 49. First D flip-flop 44 is operable to receive timing from the reference clock signal outputted from oscillator 18. Second D flip-flop 46 and third D flip-flop 48 are operable to receive timing from the inverse of the slave local clock signal outputted from slave phase lock loop circuitry 32.

The reset slave signal generated by reset generation circuitry 26 is applied to the D input of flip-flop 44. The Q output of first D flip-flop 44 is applied to AND gate 49 and the D input of second D flip-flop 46. The inverse of the Q output of second flip-flop 46 is also applied to AND gate 49. The output of AND gate 49 is applied to the D input of third flip-flop 48. The Q output of flip-flop 48 comprises the reset detection signal which is applied to slave divider 34.

Referring to FIG. 6, a timing diagram 50 illustrates the timing of various signals within electrical device 10. Signal 52 comprises the reference clock signal generated by oscillator 18. Signals 54–66 correspond to signals generated within master circuit 12. Signals 68–78 correspond to signals generated within slave circuit 14.

Timing diagram 50 illustrates synchronization of master circuit 12 and slave circuit 14. Following the reception of the external reset signal, a reset zero signal is generated to synchronize the external reset with position zero of master divider 24. Thereafter, the reset slave signal is applied from master circuit 12 to slave circuit 14 corresponding to the falling edge of the reference clock signal. A reset slave synchronization signal is generated to synchronize the received reset slave signal (received responsive to the external reset signal) and the reference clock. Thereafter, slave divider 34 is set to a predefined position for synchronization with master divider 24.

Reference clock signal 52 is applied to master phase lock loop circuit 22 via bus 20. Master phase lock loop circuit 22 is configured to output master internal clock signal 54 responsive to reference clock signal 52. As illustrated, master internal clock signal 54 has a frequency four times the frequency of reference clock signal 52. Master reset window signal 56 corresponds to reference clock 52 being high and is asserted for one period of master internal clock signal 54.

Master divider 24 is configured to change position or count a new position during each rising edge of master local clock signal 54. As illustrated, master divider 24 is operable to count in the following sequence: position zero, position one, position two, position zero, etc. Master divider signal 60 is high corresponding to master divider 24 being at position zero. Signal 62 corresponds to the external reset signal being received within reset generation circuitry 26.

Responsive to reset generation circuitry 26 receiving the external reset signal 62, a reset zero signal 64 is generated responsive to master reset window signal 56 and master divider signal 60 being simultaneously high. Reset zero signal 64 is output from AND gate 42 in FIG. 4 and corresponds to master divider 24 being at position zero. Thereafter, reset generation circuitry 26 is configured to output the reset slave signal 66 following the assertion of the reset zero signal 64 and corresponding to a falling edge 80 of reference clock signal 52.

The generation of reset slave signal 66 is responsive to the reference clock signal 52, external reset signal 62 and the position of master divider 24. In particular, reset slave signal 66 is synchronized with reference clock 52, external reset signal 62 and a predefined position of master divider 24.

Reset slave signal 66 is applied to reset detection circuitry 30 of slave circuit 14. Slave circuit 14 generates slave local clock signal 68, internal reset slave synchronization signal 72 and reset detection signal 74. Responsive to the assertion of the reset slave signal 66, reset detection circuitry 30 is configured to generate internal reset slave synchronization signal 72. Reset slave synchronization 72 is outputted from the output Q of D flip-flop 44. Reset detection circuitry 30 outputs internal reset slave synchronization signal 72 responsive to a rising edge 82 of reference clock signal 52 and three cycles of master local clock signal 54 following the assertion of reset zero signal 64. Reset detection signal 74 is enabled following the assertion of internal reset slave synchronization signal 72. Slave circuit 14 is configured to generate reset detection signal 74 synchronized with reference clock signal 52, and reset slave synchronization signal 72. Following the assertion of reset detection signal 74, slave divider 34 is set to a predefined position as indicated by line 76.

In particular, the predefined position is position one (1) in the described embodiment. Following assertion of reset detection signal 74, slave divider 34 is set to position one and begins counting position one, position two, position zero, position one, etc. responsive to slave local clock signal 68 outputted from slave phase lock loop 32. Reset detection signal 74 is asserted after four cycles of slave local clock 68 following a rising edge of reset zero signal 64. Reset zero signal 64 corresponds to master divider 24 being at position zero. Thus, slave divider 34 is set to position one (i.e., corresponding to four positions following position zero of master divider 24) to provide synchronization of slave divider 34 with master divider 24.

Slave divider 34 is configured to output the slave internal clock signal 78 synchronized with master internal clock signal 60 and responsive to the setting the position of slave divider 34. Slave divider 34 is configured to output the slave internal clock signal 78 responsive to reference clock signal 52. Slave divider 34 outputs a logic high signal within slave internal clock signal 78 corresponding to slave divider 34 being at position zero as illustrated in FIG. 6. Otherwise, slave divider 34 outputs a logic low signal within slave internal clock signal 78 corresponding to position one and position two.

Referring to lines 60 and 78, the master internal clock signal and the slave internal clock signal are synchronized to facilitate the communication of data between master circuit 12 and slave circuit 14. In particular, master divider 24 and slave divider 34 are in phase following a reset condition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A circuit assembly comprising:
   an oscillator configured to generate a reference clock signal;
   a first circuit including:
   a first divider configured to generate a first internal clock signal responsive to the reference clock signal; and
   reset generation circuitry configured to receive an external reset signal and generate a reset second circuit signal synchronized with a predefined position of the first divider, with the reference clock signal and with the external reset signal; and
   a second circuit including:
   reset detection circuitry configured to generate a reset detection signal synchronized with the reset second circuit signal and the reference clock signal; and
   a second divider configured to set to a predefined position responsive to the reception of the reset detection signal and generate a second internal clock signal synchronized with the first internal clock signal.

2. The circuit assembly according to claim 1 further comprising first phase lock loop circuitry and second phase lock loop circuitry respectively configured to generate a first local clock signal and a second local clock signal responsive to the reference clock signal, and the first internal clock signal and second internal clock signal being generated responsive to the respective first local clock signal and second local clock signal.

3. The circuit assembly according to claim 2 wherein the reset detection circuitry is further configured to output the reset detection signal synchronized with the second local clock signal.

4. The circuit assembly according to claim 1 wherein the second divider is further configured to set to the predefined position to synchronize with the first divider.

5. The circuit assembly according to claim 1 wherein the predefined position of the second divider corresponds to a position of the first divider.

6. The circuit assembly according to claim 1 wherein the first divider and second divider individually comprise a counter configured to count a plurality of positions.

7. A circuit assembly comprising:
   a first circuit configured to receive an external reset signal and generate a first internal clock signal using a first divider, the first circuit being further configured to generate a reset second circuit signal synchronized with the external reset signal and a predefined position of the first divider; and
   a second circuit configured to receive the reset second circuit signal and generate a second internal clock signal using a second divider, the second circuit being further configured to set a position of the second divider responsive to the reset second circuit signal to synchronize the second internal clock signal with the first internal clock signal.

8. The circuit assembly according to claim 7 further comprising first phase lock loop circuitry and second phase lock loop circuitry respectively configured to generate a first local clock signal and a second local clock signal responsive to the reference clock signal, and the first internal clock signal and second internal clock signal being generated responsive to the respective first local clock signal and second local clock signal.

9. The circuit assembly according to claim 8 wherein the reset detection circuitry is further configured to output the reset detection signal synchronized with the second local clock signal.

10. The circuit assembly according to claim 7 further comprising an oscillator configured to generate a reference clock signal.

11. The circuit assembly according to claim 10 wherein the first divider and the second divider are individually configured to generate the respective first internal clock signal and second internal clock signal responsive to the reference clock signal.

12. The circuit assembly according to claim 10 wherein the first circuit is further configured to synchronize the reset second circuit signal with the reference clock signal.

13. The circuit assembly according to claim 10 wherein the second circuit is configured to generate a reset detection signal responsive to synchronization of the reset second circuit signal and the reference clock signal, and the second divider is configured to set to a predefined position responsive to the reset detection signal.

14. A circuit assembly comprising:
    a first circuit configured to receive an external reset signal and generate a first internal clock signal, the first circuit being further configured to generate a reset second circuit signal responsive to the external reset signal; and
    a second circuit configured to receive the reset second circuit signal and generate a second internal clock signal synchronized with the first internal clock signal, the second circuit being configured to generate the second internal clock signal responsive to the reset second circuit signal.

15. The circuit assembly according to claim 14 further comprising an oscillator configured to generate a reference clock signal.

16. The circuit assembly according to claim 15 wherein the first circuit is further configured to synchronize the reset second circuit signal with the reference clock signal.

17. The circuit assembly according to claim 15 wherein the first circuit comprises a first divider configured to genes the first internal clock signal and the second circuit comprises a second divider configured to generate the second internal clock signal, and the first divider and the second divider are individually configured to generate the respective first internal clock signal and second internal clock signal responsive to the reference clock signal.

18. The circuit assembly according to claim 15 wherein the second circuit is configured to generate a reset Detection signal responsive to synchronization of the reset second circuit signal and the reference clock signal, and the second divider is configured to set to a predefined position responsive to the reset detection signal.

19. The circuit assembly according to claim 14 wherein the first circuit comprises a first divider configured to generate the first internal clock signal and the second circuit comprises a second divider configured to generate the second internal clock signal.

20. The circuit assembly according to claim 19 wherein the first circuit is configured to generate the reset second circuit signal responsive to synchronization of the external reset signal and a position of the first divider.

21. The circuit assembly according to claim 19 wherein the second divider is configured to set to a position responsive to the reset second circuit signal to synchronize the second internal clock signal with the first internal clock signal.

22. The circuit assembly according to claim 19 further comprising an oscillator configured to generate a reference cock signal, and wherein the second circuit is configured to generate a reset detection signal responsive to synchronization of the reset second circuit signal and the reference clock signal and the second divider is configured to set to a predefined position responsive to the reset detection signal.

23. A circuit assembly comprising:
an oscillator configured to generate a reference clock signal;
a master circuit coupled with the oscillator and configured to receive the reference clock signal, the master circuit including:
master phase lock loop circuitry configured to generate a master local clock signal responsive to the reference clock signal;
a master divider configured to generate a master internal clock signal responsive to the master local clock signal and a master divider signal indicating a position of the master divider; and
reset generation circuitry coupled with the oscillator, master phase look loop circuitry and master divider and configured to receive an external reset signal, the reset generation circuitry being further configured to generate a reset slave signal synchronized with the master divider signal, with the reference clock signal and with the external reset signal; and
a slave circuit coupled with the oscillator and the master circuit, the slave circuit including:
slave phase lock loop circuitry configured to generate a slave local clock signal responsive to the reference clock signal;
reset detection circuitry coupled with the oscillator, reset generation circuitry, and slave phase lock loop circuitry, the reset detection circuitry being configured to generate a reset detection signal responsive to synchronization of the reset slave signal and the reference clock signal; and
a slave divider configured to set to a predefined position responsive to reception of the reset detection signal and generate a slave internal clock signal synchronized with the master internal clock signal, the slave divider being further configured to generate the slave internal clock signal responsive to the slave local clock signal and the position of the slave divider being set.

24. A method of synchronizing plural circuits comprising:
applying a reference clock signal to a first circuit and a second circuit;
generating a first internal clock signal responsive to the reference clock signal using a first divider;
receiving an external reset signal within the first circuit;
generating a reset second circuit signal synchronized with the external reset signal and a position of the first divider;
setting a position of a second divider responsive to the reset second circuit signal; and
generating a second internal clock signal synchronized with the first internal clock signal, the generating the second internal clock signal being responsive to the setting.

25. The method according to claim 24 wherein the generating the second internal clock signal is responsive to the reference clock signal.

26. The method according to claim 24 further comprising generating a first local clock signal and a second local clock signal responsive to the reference clock signal.

27. The method according to claim 26 further comprising adjusting the respective positions of the first divider and the second divider responsive to the respective first local clock signal and the second local clock signal.

28. The method according to claim 26 wherein the generating the first internal clock signal and the generating the second internal clock signal are responsive to the respective first local clock signal and the second local clock signal.

29. The method according to claim 24 wherein the setting synchronizes the second divider with the first divider.

30. The method according to claim 24 wherein the generating the reset second circuit signal is further synchronized with the reference clock signal.

31. A method of synchronizing plural circuits comprising:
providing a first circuit coupled with a second circuit;
generating a first internal clock signal using a first divider;
receiving an external reset signal within the first circuit;
generating a reset second circuit signal responsive to the external reset signal;
setting a position of a second divider responsive to the reset second circuit signal; and
generating a second internal clock signal synchronized with the first internal clock signal, the generating the second internal clock signal being responsive to the setting.

32. The method according to claim 31 further comprising applying a reference clock signal to the first circuit and the second circuit.

33. The method according to claim 32 wherein the generating the first internal clock signal and the second internal clock signal are responsive to the reference clock signal.

34. The method according to claim 32 wherein the generating the reset second circuit signal is responsive to the reference clock signal.

35. The method according to claim 32 further comprising generating a reset detection signal using the second circuit and responsive to the reset second circuit signal and the reference clock signal, and the setting is responsive to the generating the reset detection signal.

36. The method according to claim 32 further comprising generating a first local clock signal and a second local clock signal responsive to the reference clock signal.

37. The method according to claim 36 further comprising adjusting the position of the first divider and the position of the second divider responsive to the respective first local clock signal and the second local clock signal.

38. The method according to claim 36 wherein the generating the first internal clock signal and the generating the second internal clock signal are responsive to the respective first local clock signal and the second local clock signal.

39. The method according to claim 31 wherein the setting synchronizes the second divider with the first divider.

40. The method according to claim 31 further comprising generating a reset detection signal responsive to the reset second circuit signal and the setting is responsive to the reset detection signal.

41. A method of synchronizing plural circuits comprising:
generating a first internal clock signal to provide timing within a first circuit;
receiving an external reset signal within the first circuit;
generating a reset second circuit signal using the first circuit and responsive to the external reset signal;
receiving the reset second circuit signal within a second circuit coupled with the first circuit; and
generating a second internal clock signal synchronized with the first internal clock signal to provide timing within the second circuit, the generating the second internal clock signal being responsive to the receiving the reset second circuit signal.

42. The method according to claim 41 further comprising generating a reference clock signal.

43. The method according to claim 42 wherein the generating the second internal clock signal is responsive to the reference clock signal.

44. The method according to claim 42 further comprising generating a first local clock signal and a second local clock signal responsive to the reference clock signal.

45. The method according to claim 44 further comprising:
generating the first internal clock signal using a first divider; and
generating the second internal clock signal using a second divider.

46. The method according to claim 45 further comprising adjusting the position of the first divider and the position of the second divider responsive to the respective first local clock signal and the second local clock signal.

47. The method according to claim 45 wherein the setting synchronizes the second divider with the first divider.

48. The method according to claim 44 wherein the generating the first internal clock signal and the generating second internal clock signal are responsive to the respective first local clock signal and the second local clock signal.

49. The method according to claim 42 wherein the generating the reset second circuit signal is responsive to the reference clock signal.

50. The method according to claim 49 further comprising generating a reset detection signal responsive to the reset second circuit signal and the setting being responsive to the reset detection signal.

51. The method according to claim 50 wherein the generating the reset detection signal is responsive to the reference clock signal.

52. A method of synchronizing plural circuits comprising:
first generating a first internal clock signal using a first divider;
timing operations of a first circuit using the first internal clock signal;
receiving an external reset signal;
setting a second divider to a predefined position following the receiving the external reset signal;
second generating a second internal clock signal following the setting and using the second divider, the second internal clock signal being synchronized with the first internal clock signal; and
timing operations of a second circuit using the second internal clock signal.

53. The method according to claim 52 further comprising:
first synchronizing the external reset signal with a position of the first divider;
second synchronizing with a first edge of a reference clock following the first synchronizing; and
third synchronizing with another edge of the reference clock following the second synchronizing, the setting being responsive to the third synchronizing.

54. The method according to claim 52 further comprising:
generating a first local clock signal responsive to the reference clock signal;
changing the position of the first divider using the first local clock signal;
generating a second local clock signal responsive to the reference clock signal; and
changing the position of the second divider using the second local clock signal.

* * * * *

UNITED STATES PATENT AND TRADEMARK OFFICE
CERTIFICATE OF CORRECTION

PATENT NO : 6,118,314
DATED : September 12, 2000
INVENTOR(S) : Patrick Arnould and Frederic Hayem It is certified that error appears in the above-identified patent and that said Letters Patent are hereby corrected as shown below:

Col. 10, line 37
 replace "genes"
 with --generate--.

Col. 10, line 45
 replace "Detection"
 with --detection--.

Col. 10, line 66
 replace "cock"
 with --clock--.

Signed and Sealed this

Eighth Day of May, 2001

*Attest:*

NICHOLAS P. GODICI

*Attesting Officer*       Acting Director of the United States Patent and Trademark Office